US009973708B2

(12) United States Patent
Seger et al.

(10) Patent No.: US 9,973,708 B2
(45) Date of Patent: May 15, 2018

(54) OPTICAL DETECTOR

(71) Applicant: Robert Bosch GmbH, Stuttgart (DE)

(72) Inventors: Ulrich Seger, Leonberg-Warmbronn (DE); Jan Sparbert, Rutesheim (DE)

(73) Assignee: ROBERT BOSCH GMBH, Stuttgart (DE)

( * ) Notice: Subject to any disclaimer, the term of this patent is extended or adjusted under 35 U.S.C. 154(b) by 0 days. days.

(21) Appl. No.: 15/381,317

(22) Filed: Dec. 16, 2016

(65) Prior Publication Data
US 2017/0180621 A1    Jun. 22, 2017

(30) Foreign Application Priority Data
Dec. 17, 2015  (DE) .................. 10 2015 225 797

(51) Int. Cl.
| H04N 5/235 | (2006.01) |
| H04N 5/225 | (2006.01) |
| H04N 5/378 | (2011.01) |
| H01L 27/30 | (2006.01) |

(52) U.S. Cl.
CPC ......... *H04N 5/2353* (2013.01); *H01L 27/307* (2013.01); *H04N 5/2258* (2013.01); *H04N 5/378* (2013.01)

(58) Field of Classification Search
None
See application file for complete search history.

(56) References Cited

U.S. PATENT DOCUMENTS

| 5,965,875 | A | 10/1999 | Merrill |
| 7,075,079 | B2 * | 7/2006 | Wood ................. G01J 3/36 250/332 |
| 7,164,444 | B1 | 1/2007 | Merriii |
| 8,193,542 | B2 * | 6/2012 | Maehara ........... H01L 27/307 257/82 |
| 9,277,146 | B2 * | 3/2016 | Baek .................... H04N 5/3535 |
| 9,680,104 | B2 * | 6/2017 | Udaka ................ H01L 27/307 |
| 9,749,553 | B2 * | 8/2017 | Borthakur ............ H04N 5/332 |
| 2007/0076108 | A1 | 4/2007 | Misawa |
| 2013/0076910 | A1 * | 3/2013 | Scott ................. H04N 5/332 348/164 |
| 2014/0327061 | A1 | 11/2014 | Lee |
| 2015/0054962 | A1 | 2/2015 | Borthakur et al. |

FOREIGN PATENT DOCUMENTS

| DE | 60302896 T2 | 8/2006 |
| DE | 112008000373 T5 | 12/2009 |
| DE | 102012213189 A1 | 1/2013 |
| EP | 1330117 A2 | 7/2003 |

(Continued)

OTHER PUBLICATIONS

Fuji Photo Film Co., "FUJIFILM: 4th Generation Super CCD—Super CCD HR & Super CCD SR" 2003, Tokyo, Japan.

(Continued)

*Primary Examiner* — James Hannett
(74) *Attorney, Agent, or Firm* — Norton Rose Fulbright US LLP; Gerard Messina

(57) ABSTRACT

A sensor array including at least two image sensors situated one above the other in layers, including at least one organic semiconductor, and subdivided into pixels. The at least two image sensors are different in the size of their pixels.

13 Claims, 3 Drawing Sheets

(56) References Cited

FOREIGN PATENT DOCUMENTS

| EP | 1819151 A1 | 8/2007 |
|---|---|---|
| EP | 2117047 A1 | 11/2009 |
| WO | 2014198625 A1 | 12/2014 |

OTHER PUBLICATIONS

Aihara, Satoshi., Kubota, Misao., "Trend in Research on Organic Imaging Devices" Broadcast Technology, 2012, No. 49, pp. 140-19.

Lim, Seon-Jeong et al., "Organic-on-silicon complementary metal-oxide-semiconductor colour image sensors" Scientific Reports 5, 2015, Article 7708.

Foveon, "Foveon Fo18-50-F19 4.5 MP X3 Direct Image Sensor" Foveon Inc., Santa Clara, CA, 2004.

Darmont, Arnaud., "Methods to extend the dynamic range of snapshot active pixel sensors" SPIE 6816, Sensors, cameras, and Systems for Industrial/Scientific Applications IX, Feb. 29, 2008.

Dipert, Brian., "Seeking Clarity—Image Sensors Peer into a Blurry Future" EDN, 16, Sep. 2004, pp. 40-52.

Aihara, Satoshi, et al., "Stacked Image Sensor with Green- and Red-Sensitive Organic Photoconductive Films Applying Zinc Oxide Thin-Film Transistors to a Signal Readout Circuit" IEEE Transations on Electron Devices, vol. 56, No. 11, Nov. 2009, pp. 2570-2576.

Sakai, Toshikatsu, et al., "Color Image Sensor Using Stacked Organic Photoconductive Films with Transparent Readout Circuits Separated by Thin Insulator" Image Sensors and Imaging Systems 2014, Mar. 2014.

Seo, Hokuto, et al., "Stacked color image sensor using wavelength-selective organic photoconductive films with zinc-oxide thin film transistors as signal readout circuit" Sensors, Cameras; and Systems for Industrial/Scientific Applications XI, Jan. 25, 2010.

Seo, Hokuto, et al., "Color Sensors with Three Vertically Stacked Organic Photodetectors" Japanese Journal of Applied Physics, vol. 46, No. 49, 2007, pp. L1240-L1242.

Seo, Hokuto, et al., "A 128X96 Pixel Stack-Type Color Image Sensor: Stack of Individual Blue-, Green-, and Red-Sensitive Organic Photoconductive Films Integrated with a ZnO Thin Film Transistor Readout Circuit" Japanese Journal of Applied Physics, vol. 50, No. 2R, Feb. 2011, pp. -024103-1024103-6.

* cited by examiner

OPTICAL DETECTOR

CROSS REFERENCE

The present application claims the benefit under 35 U.S.C. § 119 of German Patent Application No. DE 102015225797.5 filed on Dec. 17, 2015, which is expressly incorporated herein by reference in its entirety.

FIELD

The present invention relates to an optical detector.

BACKGROUND INFORMATION

European Patent No. EP 1 330 117 A2 describes an image recording method, in which an image detector including a solid body, which is subdivided into multiple different pixels, is used for image recording.

German Patent Application No. DE 603 02 896 T2 describes a method for manufacturing an electro-optical cell, in particular a liquid crystal cell or an electrochemical photovoltaic cell.

PCT Application No. WO 2014/198625 A1 describes an optical detector, which includes an optical sensor and at least one photosensitive layer including at least one first and at least one second electrode between which the photosensitive layer is applied.

SUMMARY

According to the present invention, an example sensor array is provided including at least two image sensors situated one above the other in layers, constructed from at least one organic semiconductor and divided into pixels. In accordance with the present invention, the at least two image sensors differ in the size of their pixels.

The phrase "situated one above the other in layers" is understood to mean that a common virtual axis runs through the image sensors and stands essentially perpendicular on the sensing surfaces of the two image sensors. With respect to a light source to be detected by the image sensors, the image sensors are situated back-to-back accordingly, so that at least a portion of the light of the light source must first penetrate through one sensor to be detectable by the other sensor. Depending on the specific embodiment of the present invention, the two image sensors may also be situated one above the other in such a way that the image sensors have a common axis running essentially perpendicular to the sensor surfaces and approximately through the midpoints of both image sensors. The midpoints may be defined according to the shape of the image sensor, for example, the midpoint of a circle in the case of a circular image sensor or the point of intersection of the median lines in the case of a rectangular image sensor. However, the exact alignment of the image sensors relative to one another may vary, depending on the specific application.

An advantage of the present invention is that different information of a light source is detectable by image sensors situated back-to-back in layers. Due to the different pixel sizes, a higher resolved image and a lower resolved image of the same scene may be recorded at the same time.

In a preferred specific embodiment of the present invention, the sensor array includes a first image sensor and a second image sensor, the pixels of the second image sensor being 4 or 16 or 64 times larger than the pixels of the first image sensor.

This specific embodiment of the present invention offers the advantage that the pixel shapes of the two image sensors may be selected to be geometrically similar, so that the pixel shapes are the same and they differ only in size.

In one preferred specific embodiment of the present invention, at least one image sensor is partially transparent, in particular for light at wavelengths between 380 nm and 780 nm.

This specific embodiment offers the advantage that the partially transparent image sensor does not already absorb the total available radiation if the image sensor is situated in layers in front of another sensor with respect to a light source. The image sensor situated behind the partially transparent image sensor with respect to the light source is also able to detect radiation in this way. If both image sensors are to detect visible light, then at least one image sensor should be partially transparent in the wavelength range of the visible light, i.e., between about 380 nm and 780 nm.

In a preferred specific embodiment of the present invention, the organic semiconductor layers detect essentially light of wavelengths between 380 nm and 780 nm.

This specific embodiment offers the advantage that the sensor array may be used for measurements in the visible wavelength range.

According to the present invention, a method for adapting an exposure time of individual pixels and/or pixel groups of at least one image sensor in a camera is provided. The camera includes a sensor array made up of at least one first and one second image sensor. The image sensors are constructed here from at least one organic semiconductor or a combination of organic layers with an inorganic semiconductor and subdivided into pixels. The image sensors are situated one above the other in layers, the second image sensor having larger pixels than the first image sensor. At least one measured value of the second image sensor is used to change the exposure time of individual pixels and/or pixel groups of at least the first image sensor.

The method according to the present invention offers the advantage that a rapid and effective adjustment of the exposure time of at least the first image sensor may be carried out with the aid of at least one measured value of the second image sensor. In traditional systems, a change/ adjustment of the exposure time is often based on averaging of intensities of multiple pixels or all pixels of an image sensor. Due to the larger pixels of the second image sensor, such averaging may be bypassed or omitted in the method according to the present invention, thereby greatly increasing the dynamic range of the camera.

A pixel group may also be understood here to include all pixels of an image sensor. The advantage of a local change in exposure times, i.e., adaptation of the exposure time of individual pixels and/or pixel groups, is that different areas and/or objects may be exposed for different lengths of time in an image. When using an appropriate camera in a vehicle, this may be important when driving into or out of a tunnel in order to be able to recognize image objects in the darker interior of the tunnel as well as objects outside in the lighter area. This may also be advantageous for trips at night or in poor visibility, for example, so as not to have to reduce the exposure time of the entire sensor in the event of a headlight in the camera image, so that the dark areas would be even more difficult to analyze. Somewhat darker side streets may also have a longer exposure time in order to thereby facilitate detection of other road users.

In another specific embodiment of the present invention, the at least one measured value from the second image sensor and at least one measured value from the first image sensor are used to change the exposure time of individual pixels and/or pixel groups of the first image sensor.

The advantage of this specific embodiment is that measured values from the first image sensor are additionally used for changing the exposure time. Even more information is available for an optimal adjustment of the exposure time in this way.

In another specific embodiment of the present invention, the measured value from the second image sensor and/or the measured value from the first image sensor is/are used to change the exposure time of individual pixels and/or pixel groups of the second image sensor.

This specific embodiment advantageously also makes it possible to change the exposure time of the second image sensor and adapt it to the existing light conditions. A change in exposure times coordinated between the two image sensors simplifies a comparison of the measured data.

In another specific embodiment of the present invention, a difference value is formed from the measured value of the first image sensor and the measured value of the second image sensor, and the difference value is used to change the exposure time of individual pixels and/or pixel groups of the first and/or second image sensor(s).

First and second sensors are active hereby in different spectral ranges, while the first sensor detects visible light, for example, and responds only weakly to NIR radiation, the second sensor is sensitive to NIR radiation and the short-wave radiation reaches it only to a very minor extent. To increase the sensitivity of the overall system (to allow more photons to reach the sensor), it is advantageous to design the imaging optics to be very broadband. Because of metamerism effects occurring with conventional color filters, correct color signal reproduction is no longer possible unless there is the option of determining the invisible radiation component and eliminating it from the color reconstruction. A weighted difference formation from the signals of the first and second sensors makes it possible to reduce or prevent these metamerism effects.

In addition, for example, an analysis of the simultaneously occurring high green component and a high NIR component allows a simple classification of vegetation since such a reflectance characteristic occurs in particular with substances containing chlorophyll.

In another specific embodiment of the present invention, the camera includes an exposure control unit. In this case the measured value from the first image sensor and/or the measured value from the second image sensor is/are detected by the exposure control unit, and the exposure control unit changes the exposure time of individual pixels and/or pixel groups of the first and/or second image sensor based on the detected measured value(s).

A resulting advantage is to offset the exposure of the sensors in time in order to detect phase differences in modulated light, for example.

In another specific embodiment, the at least one measured value is detected by a similar method, and a similar change in exposure time is carried out on the basis of the measured value.

The advantage of this specific embodiment is that a rapid adjustment of the exposure time with the aid of at least one similar measured value of a pixel of the second image sensor is possible. Based on the size of the pixels of the second image sensor, measured values of these pixels represent a type of average of multiple small pixels of the first image sensor. Thus, no intermediate step, in which an average must be determined, for example, of the intensities, is necessary.

This permits time savings and greatly increases the controllable dynamic range of the sensor array.

DETAILED DESCRIPTION OF EXAMPLE EMBODIMENTS

In the present exemplary embodiment, image sensors 203, 204 used in camera design 201 are constructed like optical sensor 112 described in PCT Application No. WO 2014/198625 A1. The electrical wiring may also be implemented similar to that of optical detector 110 described in PCT Application No. WO 2014/198625 A1. To avoid any ambiguities, the complete contents of the PCT Application No. WO 2014/198625 A1 is expressly incorporated herein by reference in its entirety.

Figure 1:
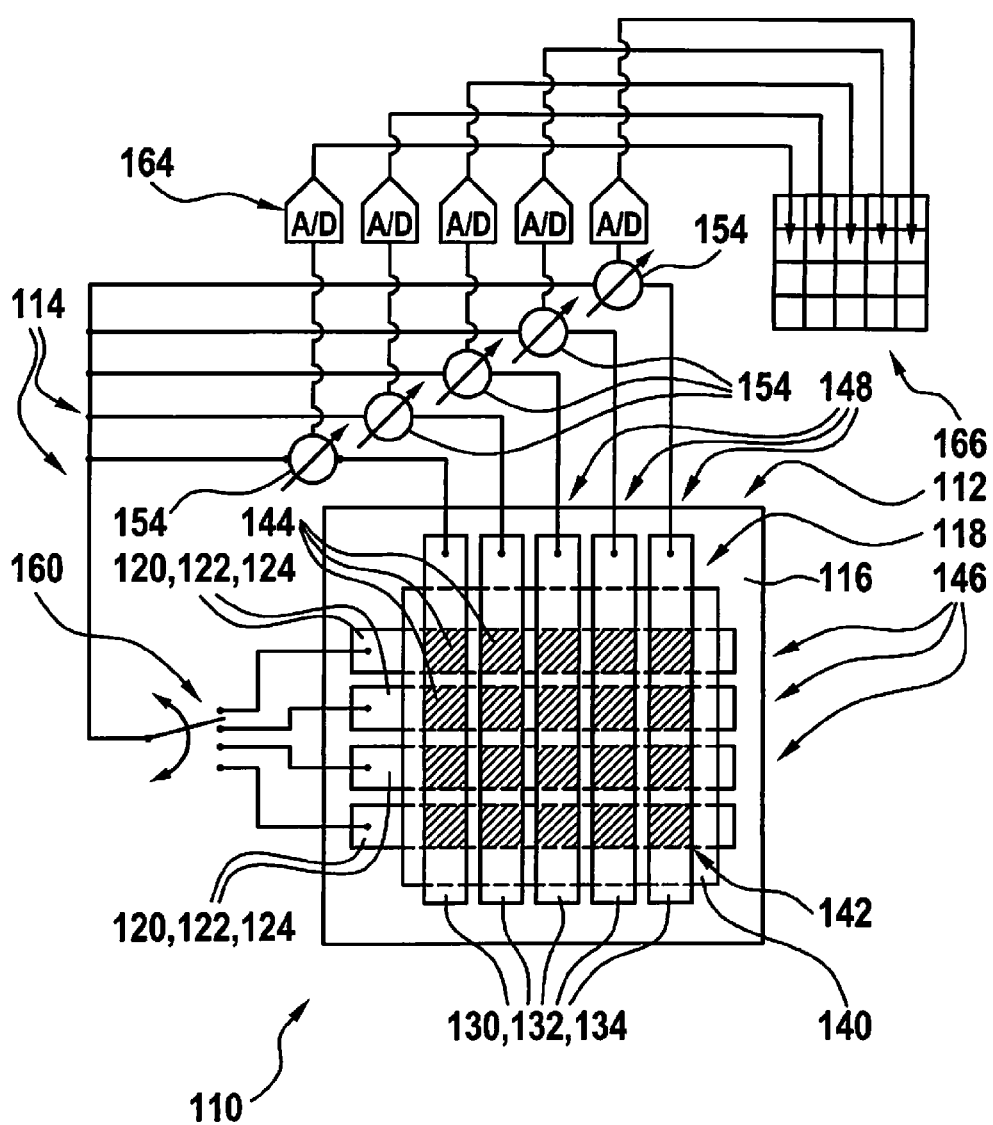
FIG. 1 shows an exemplary design of an image sensor.

Optical detector 110 illustrated in FIG. 1 has at least one image sensor 112, which includes a substrate 116 and at least one photosensitive structure 118, situated on substrate 116. Photosensitive structure 118 includes at least one first electrode 120, at least one second electrode 130 and at least one photosensitive material 140, which is situated between electrodes 120, 130. Photosensitive material 140 contains at least one organic material. First electrode 120 and second electrode 130 include multiple first electrode strips 124 and multiple second electrode strips 134, first and second electrode strips 124, 134 intersecting, and a pixel matrix 142 being formed from pixels 144 at the points of intersection. Furthermore, optical detector 110 includes a readout unit 114, which includes a switching unit 160 and multiple electrical measuring units 154, measuring units 154 being contacted to second electrode strips 134. Switching unit 160 is designed to subsequently connect first electrode strips 124 electrically to measuring units 154.

In one specific embodiment of optical detector 110, pixel matrix 142 has rows 146 formed by first electrode strips 124 and columns 148 formed by second electrode strips 134. Each electrical measuring unit 154 here is connected to a column 148, so that electrical signals of pixels 144 of pixel matrix 142 of each row 146 may be measured simultaneously. Switching unit 160 is designed to subsequently connect rows 146 to electrical measuring units 154.

Electrical measuring units 154 may be designed as analog measuring units 154, optical detector 110 additionally including an analog-digital converter 164 in this case.

In addition, readout unit 114 may include a data memory 166 for storing values for pixels 144 of pixel matrix 142.

In this exemplary embodiment, first electrode 120 is a lower electrode 122, and second electrode 130 is an upper electrode 132, lower electrode 122 being mounted on substrate 116. Photosensitive material 140 here is applied to lower electrode 122 and covers it at least partially. Upper electrode 132 is applied to photosensitive material 140.

Upper electrode 132 may include multiple metallic electrode strips 190, metallic electrode strips 190 being electrically insulated by insulators 192.

Image sensor 112 may include at least one n-doped metal oxide 174, 176, preferably a nanoporous n-doped semiconductor metal oxide 176, electrically insulating insulators 192 being applied to n-doped semiconductor metal oxides 174, 176.

In addition, optical detector 110 may contain at least p-doped organic semiconductor material 180, which is situated on n-doped semiconductor metal oxide 174, 176; p-doped organic semiconductor material 180 here is subdivided into multiple strip-shaped areas in addition to electrically insulating insulators 192.

Upper electrode 132 in this exemplary embodiment is transparent and may include at least one metal layer 184, upper electrode 132 may include at least one electrically conductive polymer 186, which is embedded between photosensitive material 140 and metal layer 184.

Instead of using an image sensor designed described in PCT Application No. WO 2014/198625 A1, any other sensors constructed of organic semiconductors may also be used, such as the sensor described in German Patent Application No. DE 603 02 896 T2, for example.

Figure 2:
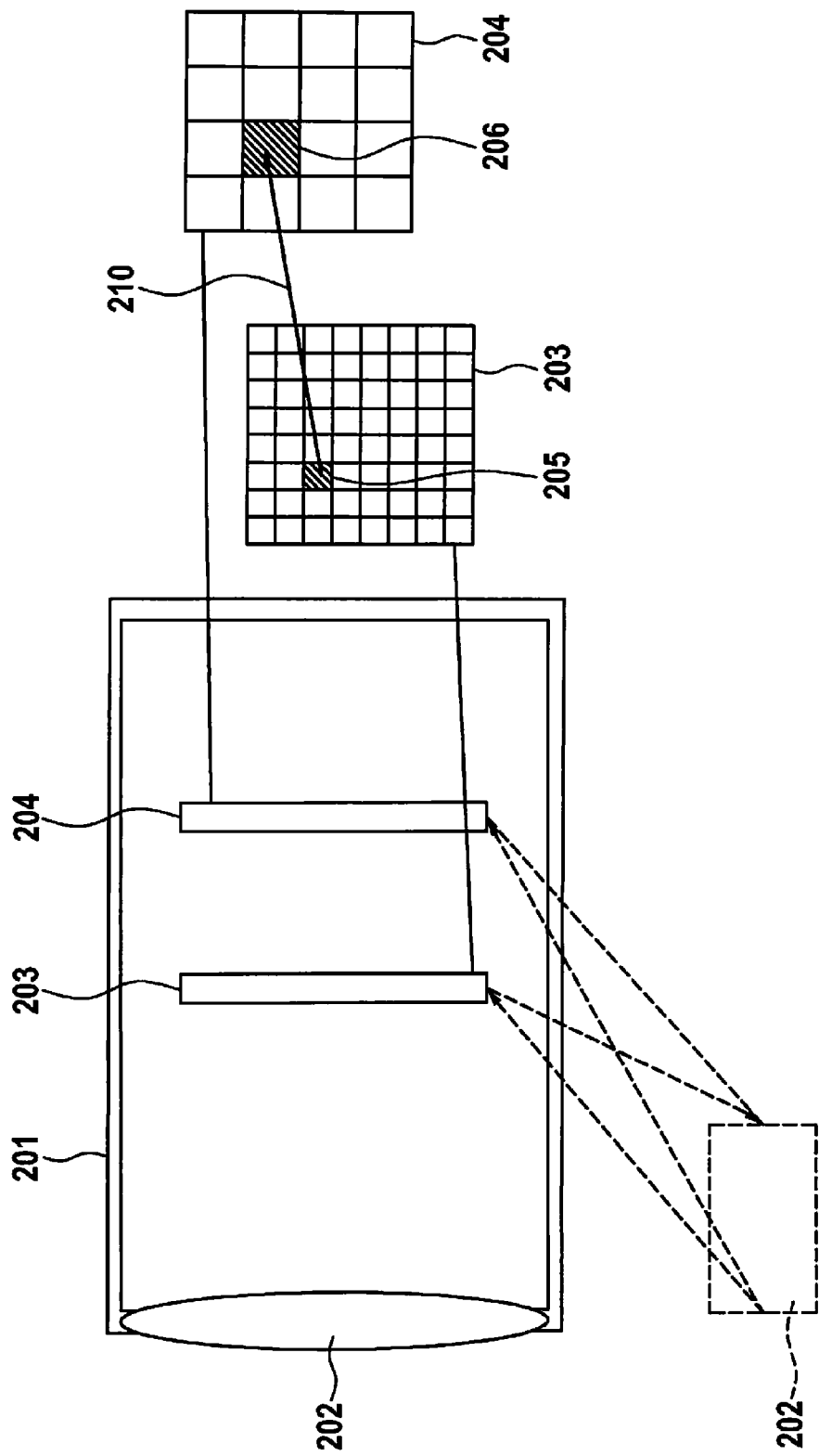
FIG. 2 shows an exemplary sensor array.

A camera 201 is outlined in FIG. 2, in which an exemplary sensor array is installed.

The sensor array described here has at least two image sensors 203, 204 situated back-to-back. Photosensitive material 140 of first image sensor 203 here has a broadband sensitivity, so it is able to detect wavelengths in a broad spectrum. For example, camera structure 201 may be designed to detect light in the visible wavelength range, for example, in a wavelength range between 380 nm and 780 nm. However, other wavelength ranges may also be selected here or the wavelength range may be increased. Additional detection of infrared and/or ultraviolet radiation would also be possible, for example.

Photosensitive material 140 used here of second image sensor 204, which is situated in a layer behind first image sensor 203 with respect to optics 202, also has a broadband sensitivity. Second image sensor 203 is designed in such a way that it has larger pixels 205, 206 in comparison with first image sensor 203. Pixels 206 of second image sensor 204 may either be larger by an integral multiple than pixels 205 of first image sensor 203, for example, 2, 4 or 16 times larger, or larger by an arbitrary factor, for example, by a factor of 2.1234252. In this exemplary embodiment, pixels 206 of second image sensor 204 are four times larger than pixels 205 of first image sensor 203.

The measured values of second image sensor 204 may be used in this camera structure 201 to create a type of low-pass-filtered average signal. Since pixels 206 of second image sensor 204 are several times larger than pixels 205 of first image sensor 203, the measured intensity signals of a pixel 206 of second image sensor 204 form a type of average of multiple pixels 205 of first image sensor 203. FIG. 2 shows as an example a beam of light 210 running horizontally in camera structure 201, which is detected by a pixel 205 of first image sensor 203 and a pixel 206 of second image sensor 204 and illustrates the system of image sensors 203, 204 and of respective pixels 205, 206.

The measured average signal of second image sensor 204 may now be analyzed together with a signal of first image sensor 203, for example. A difference signal may now be formed from measured values of individual pixels 205 of the first image sensor and measured values of individual pixels 206 of the second image sensor.

This difference signal permits local adaptation of the signal resolution because the illumination background is eliminated and thus there may be a very high resolution of the difference signal. The sensor is thus very sensitive to minor local contrast differences and therefore textures of illuminated surfaces are able to enhance pixels 205, 206 and/or pixel groups of first and/or second image sensor(s) 203, 204 very well. The background suppression may be carried out with a readout of the sensor in the normal mode in alternation. In a first step, the pixel of the first sensor is read out by itself, then the difference image from the first and second sensors is read out.

The two readings are combined to form a first image with a lower contrast resolution but a high allowed input signal and a second image with a low input signal dynamic but high contrast resolution. Contour recognition of objects in the first image is very successful, although the textures are not usually resolved, but textures may be recognized very well in the second image.

Figure 3:
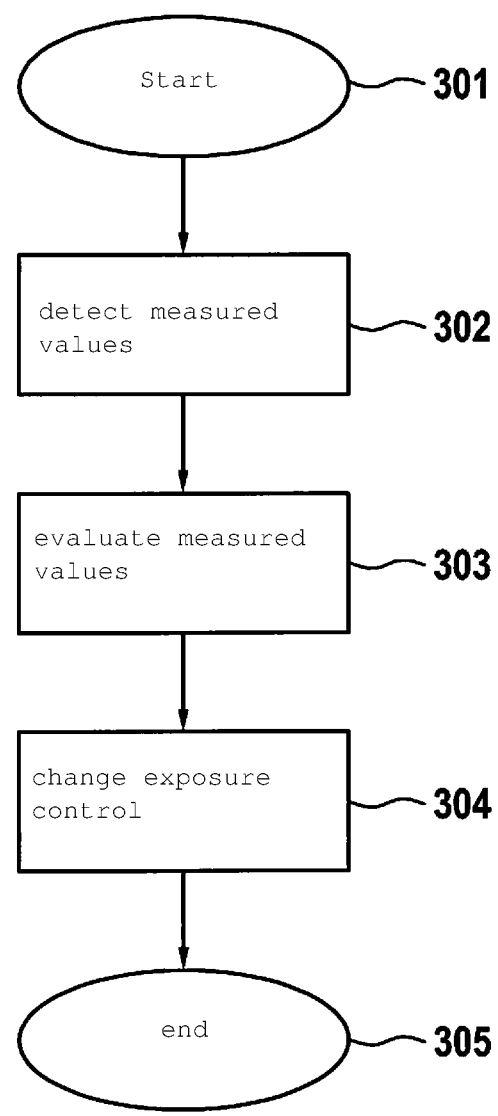
FIG. 3 shows a flowchart of an example method for adjusting exposure control.

This adjustment may take place by the method illustrated in FIG. 3, for example. This method starts in step 301. In step 302, the measured values of individual image sensors 203, 204 and individual pixels 205, 206 of image sensors 203, 204 are detected by an illumination control/signal processing unit 209.

In step 303, the measured values are evaluated with the aid of a calculation of difference values for different pixels 205, 206 or pixel groups of first and/or second image sensors 203, 204, for example.

Based on analysis of the measured values and/or difference values, exposure control unit 209 may then change the exposure time of individual pixels 205, 206 and/or individual pixel groups of image sensors 203, 204 in step 304.

For this purpose, the signal of the second sensor is utilized to control the pulse width of a frequency-modulated transfer gate, for example. The less light arrives at the second sensor, the shorter is the opening of a transfer gate between the diode and a reset signal, for example. Consequently, more time remains for signal integration.

The method ends in step 305.

In addition or in an alternative embodiment, the measured values of first and/or second image sensor(s) 203, 204 may be utilized to adjust the exposure time of both image sensors 203, 204. Exposure control unit 209 may be implemented with an analog circuit, for example. The dynamic range of camera structure 201 may be greatly increased by such a design.

Instead of one first image sensor 203, it is also possible to use multiple partially transparent image sensors, which differ in their spectral sensitivity. Thus, for example, they are able to absorb radiation of certain wavelengths and allow radiation of certain wavelengths to pass through unhindered. In this way, a color sensor such as that described in WO 2014/198625, for example, may be implemented.

The array of image sensors 203, 204 may also be arbitrarily varied, so that second image sensor 204, which has larger pixels 205, 206 than first image sensor 203, for example, may be situated between optics 202 and first image sensor 203.

What is claimed is:

1. A sensor array, comprising:
at least two image sensors situated one above the other in layers, and constructed of at least one organic semiconductor and subdivided into pixels, wherein a size of the pixels one of the at least two image sensors is different than a size of the pixels of another one of the at least two image sensors;
wherein the at least two image sensors includes a first image sensor and a second image sensor;
wherein the first image sensor and the second image sensor are active in different spectral ranges, and
wherein at least the second image sensor is configured to provide to an exposure control unit at least one measured value for changing an exposure time of individual pixels and/or pixel groups of at least the first image sensor.

2. The sensor array as recited in claim 1, wherein the pixels of the second image sensor are one of 4, 16, or 64 times larger than the pixels of the first image sensor.

3. The sensor array as recited in claim 1, wherein at least one of the at least two image sensors is partially transparent for light of wavelengths between 380 nm and 780 nm.

4. The sensor array as recited in claim 1, wherein the organic semiconductor layers detect light of wavelengths between 380 nm and 780 nm.

5. A method for adjusting an exposure time of individual pixels and/or pixel groups of at least one image sensor in a camera, the camera including a sensor array, which includes at least one first image sensor and one second image sensor, the sensor array being constructed of at least one organic semiconductor and being subdivided into pixels, the first image sensor and the second image sensor being situated in the layers, one above the other, and the second image sensor including larger pixels than the first image sensor, the method comprising:
acquiring at least one measured value of the second image sensor; and
using the at least one measured value of the second image sensor to change the exposure time of at least one of: individual pixels of the first image sensor, and pixel groups of the first image sensor.

6. The method as recited in claim 5, wherein the at least one measured value from the second image sensor and at least one measured value from the first image sensor are used to change the exposure time of the at least one of the individual pixels of the first image sensor, and the pixel groups of the first image sensor.

7. The method as recited in claim 5, wherein at least one of the measured value from the second image sensor, and a measured value from the first image sensor, is used to change the exposure time of the at least one of individual pixels of the second image sensor and pixel groups of the second image sensor.

8. The method as recited in claim 6, wherein a difference value is formed from the measured value of the first image sensor and the measured value of the second image sensor, and the difference value is used to change the exposure time of at least one of: i) the at least one of the individual pixels of the first image sensor and the pixel groups of the first sensor, and ii) at least one of individual pixels of the second image sensor and pixel groups of the second sensor.

9. The method as recited in claim 6, wherein the camera includes an exposure control unit, at least one of the measured value from the first image sensor and the measured value from the second image sensor being detected by the exposure control unit, and the exposure control unit changes the exposure time of at least one of: i) the at least one of the individual pixels of the first image sensor and the pixel groups of the first sensor, and ii) at least one of individual pixels of the second image sensor and pixel groups of the second sensor, based on the detected measured values.

10. The method as recited in claim 6, wherein the at least one measured value is detected similarly, and a similar change in the exposure time is made, based on the measured value.

11. The method as recited in claim 5, wherein the at least two image sensors includes a first and a second image sensor, the pixels of the second image sensor being one of 4, 16, or 64 times larger than the pixels of the first image sensor.

12. The method as recited in claim 5, wherein at least one of the at least two image sensors is partially transparent for light of wavelengths between 380 nm and 780 nm.

13. The method as recited in claim 5, wherein the organic semiconductor layers detect light of wavelengths between 380 nm and 780 nm.

* * * * *